(12) United States Patent
Pace

(10) Patent No.: US 11,049,788 B2
(45) Date of Patent: Jun. 29, 2021

(54) INTEGRATED CIRCUIT CHIP DEVICE WITH THERMAL CONTROL

(71) Applicant: Microsoft Technology Licensing, LLC, Redmond, WA (US)

(72) Inventor: Maria Esther Pace, Palo Alto, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/657,861

(22) Filed: Oct. 18, 2019

(65) Prior Publication Data

US 2021/0118763 A1  Apr. 22, 2021

(51) Int. Cl.
*H01L 23/367* (2006.01)
*H01L 31/024* (2014.01)

(52) U.S. Cl.
CPC ........ *H01L 23/3672* (2013.01); *H01L 31/024* (2013.01)

(58) Field of Classification Search
CPC .......................... H01L 23/3672; H01L 31/024
USPC ........................................................ 257/720
See application file for complete search history.

(56) References Cited

U.S. PATENT DOCUMENTS

| 5,902,556 | A  | 5/1999  | Van De Vyver et al. |
|---|---|---|---|
| 7,741,686 | B2 | 6/2010  | Khuri-Yakub et al. |
| 9,666,734 | B2 | 5/2017  | Jung et al. |
| 2005/0282381 | A1* | 12/2005 | Cohen .................. H01L 23/552 438/637 |
| 2008/0017946 | A1 | 1/2008 | Cazaux et al. |
| 2008/0224188 | A1 | 9/2008 | Han |
| 2013/0107097 | A1 | 5/2013 | Suyama et al. |
| 2013/0156368 | A1 | 6/2013 | Hanjani |
| 2014/0334106 | A1* | 11/2014 | Prest ..................... C22C 45/003 361/718 |

FOREIGN PATENT DOCUMENTS

| CN | 202488705 U | 10/2012 |
|---|---|---|
| CN | 107515235 A | 12/2017 |
| WO | 9422167 A1 | 9/1994 |

OTHER PUBLICATIONS

"KOH Etch Rate Calculator", Retrieved from: https://web.archive.org/web/20190420094209/http:/www.lelandstanfordjunior.com/KOH.html, Apr. 20, 2019, 2 Pages.

Brouwer, et al., "MEMS-based clamp with a passive hold function for precision position retaining of micro manipulators", in Journal of Micromechanics and Microengineering, vol. 19, May 22, 2009, pp. 1-22.

"International Search Report and Written Opinion Issued in PCT Application No. PCT/US20/054656", dated Feb. 4, 2021, 14 pages.

* cited by examiner

Primary Examiner — Tong-Ho Kim
(74) Attorney, Agent, or Firm — Wade IP Law PLLC

(57) ABSTRACT

An integrated circuit chip device configured provide thermal control by directing heat transfer away from a heat sensitive component. The structure directs the heat transfer away from the heat sensitive component so that the heat sensitive component can be maintained at reduced operating temperatures for improved performance.

20 Claims, 10 Drawing Sheets

INTEGRATED CIRCUIT CHIP DEVICE WITH THERMAL CONTROL

BACKGROUND

Integrated circuits can include multiple components with some of the components being more heat sensitive than other components. Some of the components may also generate heat and that heat can be transferred to the more heat sensitive components. As electronics get smaller the impact that heat generating components have on heat sensitive components becomes more significant. For example, dark current is a small electrical current that flows through photosensitive devices, such as image sensors, even when no photons are entering the device. The dark current contributes significantly to noise generated in the photosensitive devices. The magnitude of dark current can vary drastically as the temperature of the device varies and the dark current generally increases with an increase in temperature.

SUMMARY

Various approaches are described herein for, among other things, providing an improved construction for an integrated circuit chip device. For instance, an integrated circuit chip device includes a construction that provides thermal control so that heat transfer is directed away from a heat sensitive component.

An example chip device comprises a substrate, a first component, a second component, and a heat sink. The first component is disposed on the substrate. The second component is disposed on the substrate spaced from the first component and generates heat. The heat sink is coupled to the substrate so that at least a portion of the substrate is interposed between the second component and the heat sink. A thermal resistance between the second component and the heat sink is less than a thermal resistance between the second component and the first component.

A second example chip device comprises a substrate, a first component, a second component, a heat sink, and a via. The substrate is constructed from a first material having a first thermal conductivity and includes a cavity. The first component is disposed on the substrate adjacent the cavity. The second component is disposed on the substrate spaced from the first component and generates heat. The heat sink is coupled to the substrate. The via extends between the second component and the heat sink and is constructed from a second material having a second thermal conductivity that is greater than the first thermal conductivity.

An example method of making a chip device having thermal control comprises making a first wafer, populating the first wafer with a first component and a second component, making a second wafer, forming a cavity in the second wafer, forming a via in the second wafer, making a heat sink, and coupling the first wafer, the second wafer, and the heat sink. The second component is spaced from the first component and generates heat during use. The second wafer is made from a first material having a first thermal conductivity. The via is constructed from a second material having a second thermal conductivity that is greater than the first thermal conductivity. The first wafer, the second wafer, and the heat sink are coupled so that the second wafer is at least partially interposed between the heat sink and the first wafer, the first component is disposed adjacent the cavity, and the via extends between the second component and the heat sink.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Moreover, it is noted that the invention is not limited to the specific embodiments described in the Detailed Description and/or other sections of this document. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles involved and to enable a person skilled in the relevant art(s) to make and use the disclosed technologies.

FIGS. 9a-e are schematics illustrating example embodiments of the integrated circuit chip device construction in accordance with an embodiment.

Figure 10:
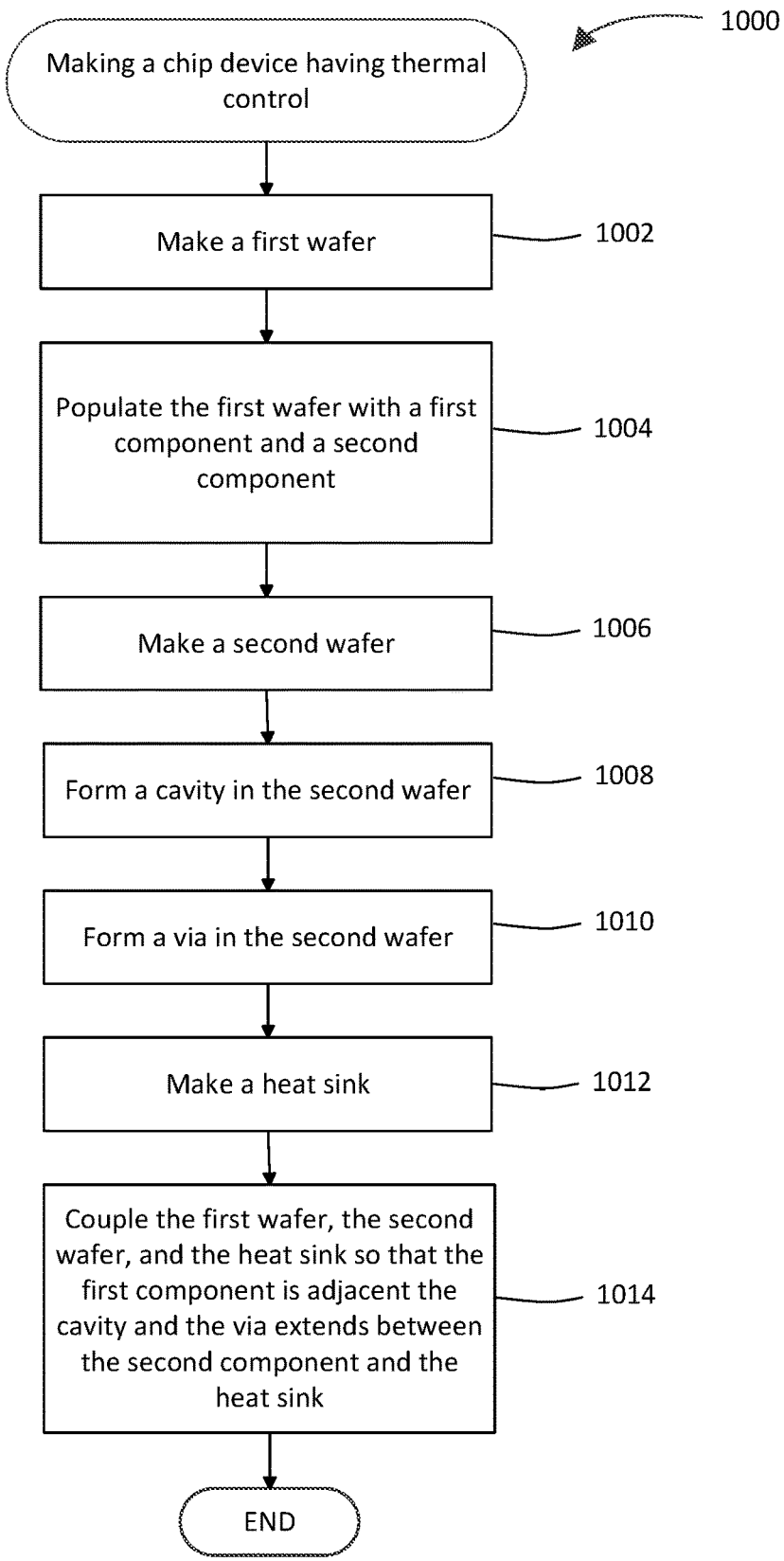

FIG. 10 depicts a flowchart of an example method for making an in integrated circuit chip device in accordance with an embodiment.

FIGS. 11a-j are schematics illustrating steps in an example method for making an integrated circuit chip device in accordance with an embodiment.

The features and advantages of the disclosed technologies will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The following detailed description refers to the accompanying drawings that illustrate example embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the relevant art(s) to implement such feature, structure, or characteristic in connection with other embodiments whether or not explicitly described.

II. Example Embodiments

Example embodiments described herein provide improvements over known constructions for integrated circuit chip devices. Example embodiments of the integrated circuit chip device construction include constructions that result in thermal control that directs heat transfer away from heat sensitive components. By directing heat transfer away from heat sensitive components, the integrated circuit chip device can provide improved performance, such as reduced noise in photosensitive devices.

The integrated circuit chip device is generally constructed using a substrate that provides structure. The construction of the substrate can be selected to direct heat transfer away from heat sensitive components. For example, the substrate can be etched so that conduction of heat to portions of the substrate adjacent the heat sensitive components can be reduced or prevented. Etching the substrate reduces the thermal mass of the substrate adjacent to the heat sensitive component and removes a conduction pathway to the heat sensitive component. Reducing heat transfer from heat generating components to the heat sensitive components can also allow cooling devices to operate more effectively to reduce the temperature of the heat sensitive devices. The chip device construction can help to achieve an optimal working temperature of a heat sensitive device of about −30° C. while including a heat generating component operating at about 40° C.

Figure 1:
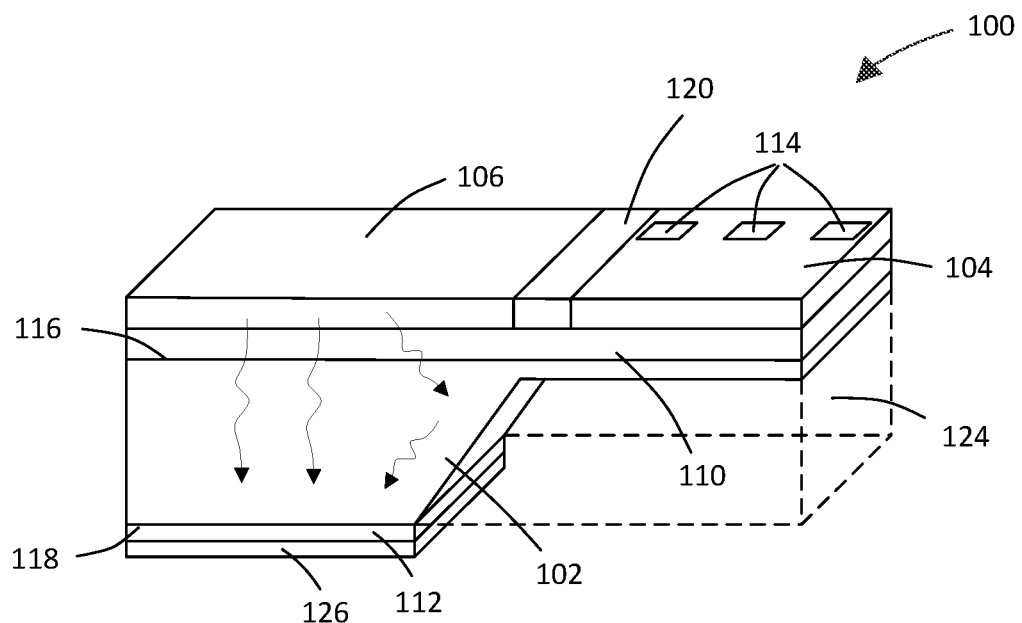
FIG. 1 is a perspective view of an example integrated circuit chip device construction in accordance with an embodiment.
Figure 2:
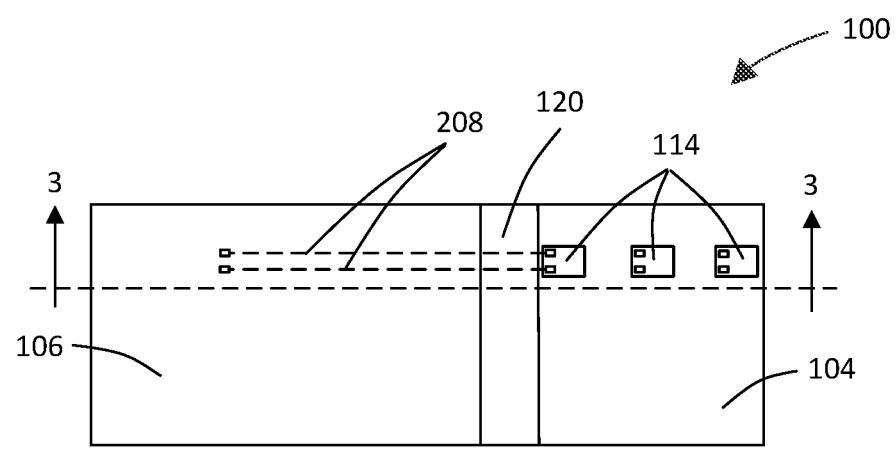
FIG. 2 is a top view of the integrated circuit chip device construction of FIG. 1 in accordance with an embodiment.
Figure 3:
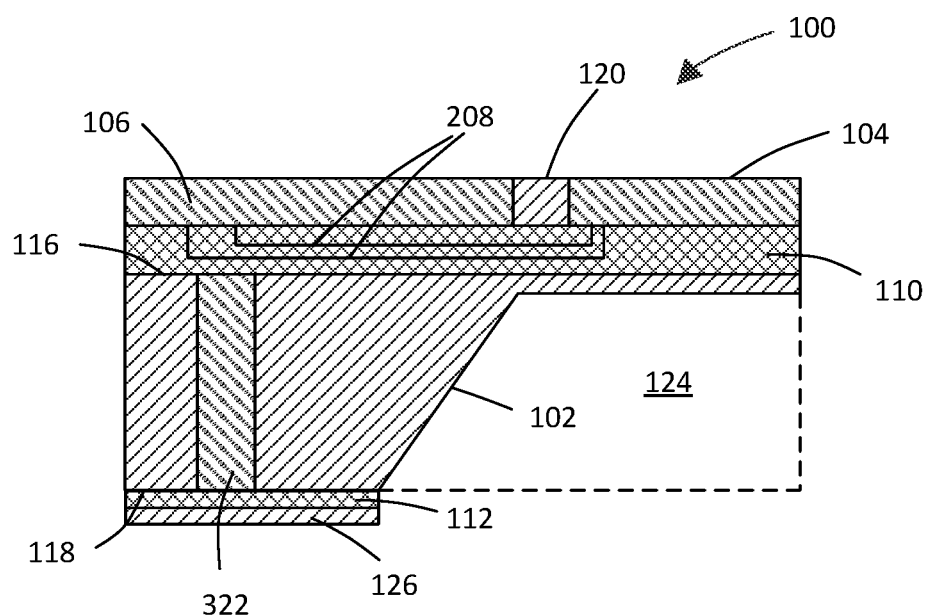
FIG. 3 is a cross-sectional view of the integrated circuit chip device construction corresponding to line 3-3 of FIG. 2, in accordance with an embodiment.

FIGS. 1-3 illustrate an example embodiment of an integrated circuit chip device 100 that includes a construction in accordance with an example embodiment. The chip device 100 comprises a substrate 102, a first component 104, a second component 106, a plurality of conductors 208, an insulating layer 110, a heat sink 112, and a cooling device 126.

The substrate 102 forms a structural component in the chip device 100 and can be shaped and sized to direct heat transfer through the chip device 100 to provide thermal control. The substrate 102 provides the structure, rigidity, and thermal stability to the chip device 100. The substrate 102 provides a support on which the first component 104 and the second component 106 can be constructed and held in a desired spatial relationship. The substrate 102 also provides the structure for supporting conductors 208 that can extend between the first component 104 and the second component 106, and/or between any other components included in the chip device 100. The substrate 102 can be formed from monocrystalline silicon, gallium arsenide, germanium, or any other structural non-electrically conductive materials. In some example embodiments, a thickness of the substrate 102 is in a range of between about 200 μm and about 400 μm. In at least one example embodiment, the thickness of the substrate 102 is about 300 μm.

The first component 104 is disposed on the substrate 102 and provides a desired functionality. In at least one example embodiment, the first component 104 is a photosensitive sensor that is constructed using germanium. The photosensitive sensor can include a plurality of pixels 114 that are arranged in an array. In some embodiments, the first component 104 is a heat sensitive component that exhibits an efficiency that changes with temperature. For example, the first component 104 can be a photosensitive sensor that has an efficiency that decreases as temperature of the first component 104 increases. As will be described in greater detail, the construction of the chip device 100 is selected to direct heat transfer away from heat sensitive components so that heat generated by other components does not detrimentally increase the temperature of the heat sensitive components.

In an example embodiment, the first component 104 is a photosensitive sensor having a 1024×1024 pixel array. For example, each pixel 114 of the array can be sized so that it is about 2.5 μm×2.5 μm, and the pixels 114 can be spaced by a distance that is about 2.5 μm. In at least one example embodiment, a plurality of conductors 208 are coupled to and extend away from each pixel 114 to form interconnects. The conductors 208 can be formed by metallic traces having a width of about 0.1 μm and a thickness of about 2200 Å. The conductors 208 can be formed from materials such as aluminum, copper, and/or gold, and they can be formed using electroplating for example. Any number of conductors 208 can be coupled to each pixel 114. In at least one example embodiment, each pixel 114 includes eight conductors 208. Additionally, the first component 104 can be constructed from a material that has a lower thermal conductivity than the substrate 102. In at least one example embodiment, the first component 104 is constructed from germanium having a thermal conductivity of about 60.0 W/mK and the substrate 102 constructed from silicon having a thermal conductivity of about 145.0 W/mK.

The second component 106 is also disposed on the substrate 102. In at least one example embodiment, the second component 106 includes components configured to perform analog to digital conversion. In such an example, the second component 106 can generate heat during use that can transfer to other portions of the chip device 100.

An insulating layer 110 can be disposed between the components, e.g., between the first component 104 and the substrate 102, and between the second component 106 and the substrate 102. In some example embodiments, the insulating layer 110 can be grown or deposited on the substrate 102. In the illustrated embodiment, the insulating layer 110 forms a first surface 116 of the substrate 102. The insulating layer 110 can provide electrical insulation between the conductors 208. The insulating layer 110 can also provide electrical insulation between the first component 104 and the substrate 102, and between the second component 106 and the substrate 102. In some example embodiments, the insulating layer 110 is formed from silicon dioxide ($SiO_2$) that is grown on the substrate 102, and the $SiO_2$ has a thermal conductivity of about 1.5 W/mK. The $SiO_2$ insulating layer 110 can be grown on a silicon substrate 102 using thermal, wet, or dry oxidation. In some example embodiments, a thickness of the insulating layer 110 is in a range between about 4.0 μm and about 5.0 μm. In at least one example embodiment, the thickness of the insulating layer 110 is about 4.5 μm.

The heat sink 112 is coupled to a portion of the substrate 102, such as a second surface 118 of the substrate 102. The heat sink 112 is generally constructed from a highly heat conductive material, such as a metallic material having a selected thermal conductivity. In some example embodiments, the heat sink 112 is constructed from a material that has greater thermal conductivity than the material that is used to construct the substrate 102. In at least one example embodiment, the substrate 102 is constructed from monocrystalline silicon having a thermal conductivity of about 145.0 W/mK and the heat sink is constructed from a metal having a thermal conductivity greater than about 145.0 W/mK. In at least one example embodiment, the heat sink 112 is constructed from aluminum having a thermal conductivity of about 237.0 W/mK. In at least one example embodiment, the heat sink 112 is constructed from copper having a thermal conductivity of about 386.0 W/mK.

The construction of the chip device 100 is configured to provide thermal control over the transfer of heat throughout, and out of, the chip device 100. In particular, the construction of the substrate 102 and/or the inclusion of one or more isolation features and one or more conduction features can be used to control heat transfer through the chip device 100. The construction of chip device 100 includes portions having materials and geometries selected so that a thermal resistance between the second component 106, i.e., a heat source, and the heat sink 112 is lower than a thermal resistance between the second component 106 and the first component 104 so that heat transfer from the second component 106 is directed away from the first component 104 and toward the heat sink 112. The thermal resistance of a structure can be defined by:

$$R = x/(A*k) \quad (1)$$

where R is the thermal resistance, x is a distance measured on a path parallel to the heat flow, A is the cross-sectional area perpendicular to the path of heat flow, and k is the thermal conductivity of the material. Additionally, the materials and geometries of the portions of the chip device 100 can be constructed to prevent a build up of heat in a portion of the substrate 102 adjacent the first component 104.

For example, a portion of the substrate 102 can be removed, or replaced, to remove a heat transfer pathway through the chip device 100. As illustrated, a portion of the substrate 102 adjacent the first component 104 that would otherwise support the first component 104, between the first component and the second surface 118 of the substrate 102, is removed, forming a cavity 124. The cavity 124 reduces the thermal mass of the substrate 102 adjacent the first component 104. Additionally, the cavity 124 reduces the available conduction path from the heat generating second component 106 toward the first component 104 which increases the thermal resistance between the second component 106 and the first component 104. The cavity 124 can be formed by etching, and the etching can be anisotropic or isotropic. In some example embodiments, the cavity 124 is formed using a wet etching technique such as ethylenediamine pyrocatechol (EDP), potassium hydroxide (KOH), or tetramethylammonium (TMAH) techniques. In at least one example embodiment, the cavity is formed using KOH etching to take advantage of the anisotropic material removal characteristics. In some example embodiments, the cavity 124 is formed using a dry etching technique such as $CF_4$, $SF_6$, $NF_3$; and $Cl_2$, $CCl_2F_2$ techniques. In at least one example embodiment, the shape of the cavity 124 can be tapered so that it widens in a direction away from the first component 104. In at least one example embodiment, the cavity includes side walls that are generally perpendicular to the second surface 118 of the substrate 102 so that the width of the cavity 124 is about constant in a direction away from the first component 104.

The cavity 124 formed in the substrate 102 can be filled. In some embodiments, the cavity 124 is at least partially filled with a material that has a thermal conductivity that is less than the thermal conductivity of the surrounding substrate material. In at least one example embodiment, the cavity 124 is filled with $SiO_2$ having a thermal conductivity of about 1.5 W/mK, and the surrounding substrate is constructed from silicon having a thermal conductivity of about 145.0 W/mK.

Additionally, in some example embodiments, the cavity 124 can be formed with a plurality of materials. For example, the cavity 124 can be first partially filled with a material having a relatively low thermal conductivity to provide increased thermal insulation closest to the first component 104. The remainder of the cavity 124, or a portion of the remainder of the cavity 124, can be subsequently filled with a material having relatively high thermal conductivity so that a larger thermally conductive surface area can be provided to couple with the heat sink 112. In an example embodiment, the cavity 124 can be partially filled with $SiO_2$ having a relatively low thermal conductivity and subsequently filled with a metallic material having a relatively high thermal conductivity.

The first component 104 and the second component 106 are spaced from each other on the substrate 102 to thermally and electrically isolate the first component 104 from the second component 106. An isolation feature, such as a shallow trench 120, an be employed to provide the isolation. The trench 120 is interposed between the first component 104 and the second component 106 and forms a boundary that that prevents, or significantly reduces, direct conduction between the first component 104 and the second component 106. In at least one embodiment, the trench 120 is filled with a material having a thermal conductivity that is less than about 145.0 W/mK. In at least one embodiment, the trench 120 is filled with a material having a thermal conductivity that is less than about 60.0 W/mK. In at least one embodiment, the trench 120 is filled with a material having a thermal conductivity that is less than about 2.0 W/mK. In at least one embodiment, the trench 120 is filled with $SiO_2$. In some example embodiments, the trench 120 forms a gap between the first component 104 and the second component 106.

Conduction features can be included in the chip device 100 to provide a higher conductivity between heat generating components and the heat sink 112. For example, the conduction features can be vias 322 that extend between the second component 106 and the heat sink 112 that are constructed from materials having heat conductivity that is greater than the thermal conductivity of the substrate 102. The greater heat conductivity can provide a lower thermal resistance between the second component 106 and the heat sink 112. For example, the vias 322 can be constructed from metallic materials that have higher heat conductivity values than the heat conductivity values of the surrounding material of the substrate 102. In an example embodiment, the surrounding material of the substrate 102 is silicon having a thermal conductivity of about 145.0 W/mK and the via 322 is constructed from a material that has a thermal conductivity that is greater than about 145.0 W/mK. For example, a metallic material can be electroplated into a channel to form the via 322. In at least one example embodiment, the via 322 is constructed from aluminum having a thermal conductivity of about 237.0 W/mK. In at least one example embodiment, the via 322 is constructed from copper having a thermal conductivity of about 386.0 W/mK.

The chip device 100 can also include a cooling device 126 to remove heat. The cooling device 126 can be a solid-state cooling device, such as a Peltier cooler, that transfers heat from one side of the cooling device 126 to the other side of the cooling device 126 with the consumption of electrical energy. As illustrated, the cooling device 126 can be coupled to the heat sink 112 to draw heat away from the heat sink 112 and away from the substrate 102. Any number of cooling devices 126 can be included in the chip device 100. In some example embodiments, a plurality of cooling devices 126 can be included and coupled to different portions of the chip device 100 to provide zoned cooling. For example, a cooling device 126 can be coupled to the heat sink 112, a cooling device 126 can be coupled to a portion of the substrate 102 adjacent the first component 104, a cooling device 126 can be coupled to a side edge of the substrate 102 adjacent the second component 106, and/or a cooling device 126 can be coupled directly to one or both of the first component 104 and the second component 106.

The locations of the first component 104 and the second component 106 on the substrate can also be used to provide thermal control. For example, a heat-sensitive component can be disposed on the substrate 102 relative to heat generating components to limit the exposure to the heat generating components. For example, the first component 104 can be disposed adjacent an outer perimeter edge of the substrate 102 so that at least a portion of the perimeter of the first component 104 is exposed to the environment instead of being adjacent the heat generating second component 106. In some example embodiments, that configuration can provide access for coupling a cooling device 126 directly to the first component 104.

Figure 4:
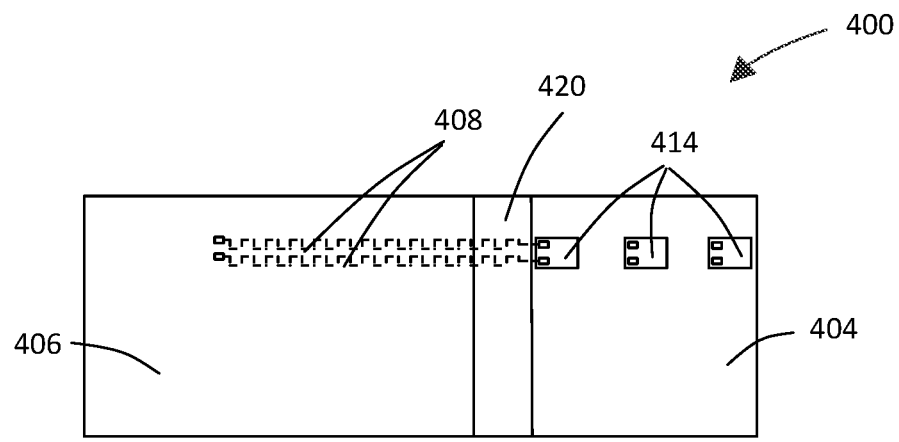
FIG. 4 is a top view of an integrated circuit chip device construction in accordance with another example embodiment.

Referring to FIG. 4, a construction of a chip device 400 can include conductors 408 that are configured to provide desired heat transfer. The chip device 400 comprises a substrate, a first component 404, a second component 406, a plurality of conductors 408, an insulating layer, and a heat sink. Except for the construction of the conductors 408, chip device 400 has a construction similar to the construction of chip device 100. The second component 406 can be a component that generates heat, such as an analog to digital converter. The conductors 408 extend between the first component 404 and the second component 406 and can provide a direct path of heat conduction from the second component 406 to the first component 404. The conductors 408 can be shaped and positioned to increase the thermal resistance between the second component 406 and the first component 404. In some example embodiments, the length of the conductors 408 can be selected to increase the distance that heat would be required to travel, thereby increasing the thermal resistance of the conductor 408. For example, the conductors 408 can be configured to have a zig-zag, or serpentine, shape to increase the length. Additionally, the shape of the conductors 408 can be selected to locate at least a portion of the conductor 408 adjacent a portion of the chip structure having higher thermal conductivity, such as near a conduction feature, such as a via, so heat can be preferentially transferred from the conductors 408 to the conduction feature instead of to the first component 404.

Figure 5:
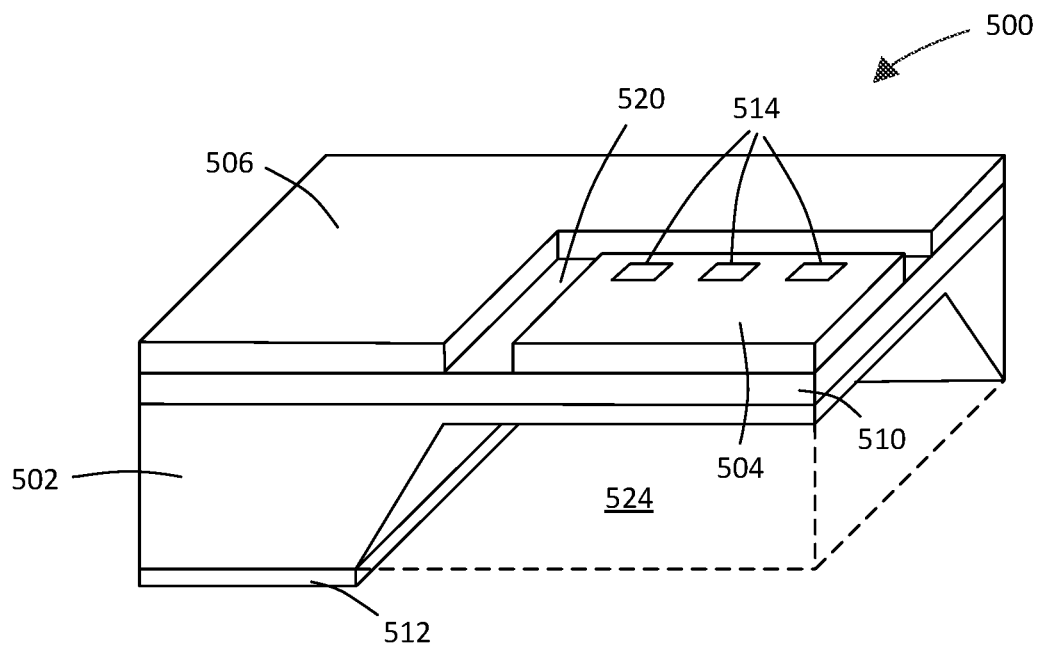
FIG. 5 is a perspective view of an example integrated circuit chip device construction in accordance with an embodiment.
Figure 6:
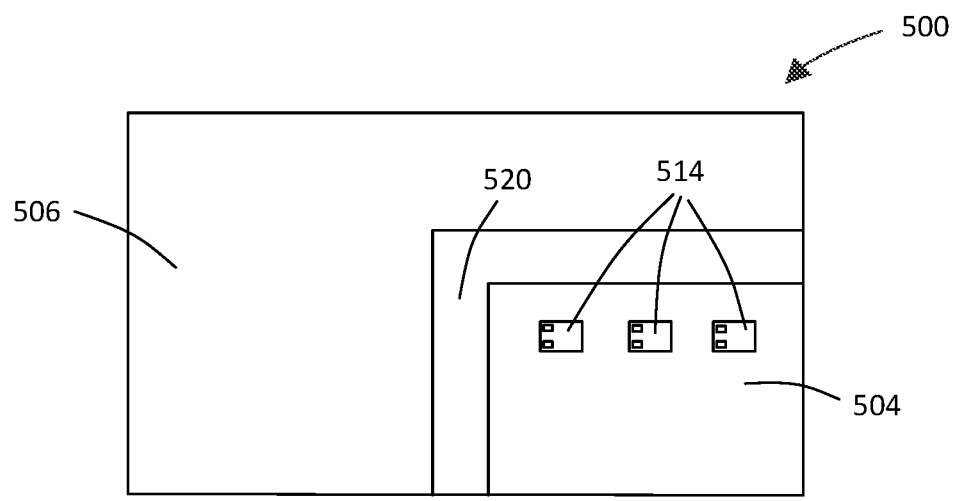
FIG. 6 is a top view of the integrated circuit chip device construction of FIG. 5 in accordance with an embodiment.

In another embodiment, illustrated in FIGS. 5 and 6, a chip device 500 includes another configuration in which a first component 504 is located at a corner of a substrate 502 so that two edges of the first component 504 are exposed adjacent to two edges of the substrate 502. The configuration can be used to alter the exposure of the first component 504 to other components of the chip device 500 that generate heat. The chip device 500 comprises a substrate 502, a first component 504, a second component 506, a plurality of conductors, an insulating layer 510, and a heat sink 512. The first component 504 can be a photosensitive sensor including an array of pixels 514 that is heat sensitive. The second component 506 can be a component that generates heat, such as an analog to digital converter and a trench 520 can be included in chip device 500 to prevent direct heat conduction between the first component 504 and the second component. The chip device 500 can also include vias, similar to vias 322 of chip device 100, that extend between the second component 506 and the heat sink 512 and that can be constructed from materials having relatively high thermal conductivity to provide lower thermal resistance between the second component 506 and the heat sink 512. A portion of the substrate 502 can be removed, such as by etching, to form a cavity 524 that reduces the thermal mass of the portion of the substrate 502 adjacent the first component 504, that would otherwise be supporting the first component 504, and that increases the thermal resistance between the second component 506 and the first component 504. Similar to previous example embodiments, the cavity 524 can be filled.

Figure 7:
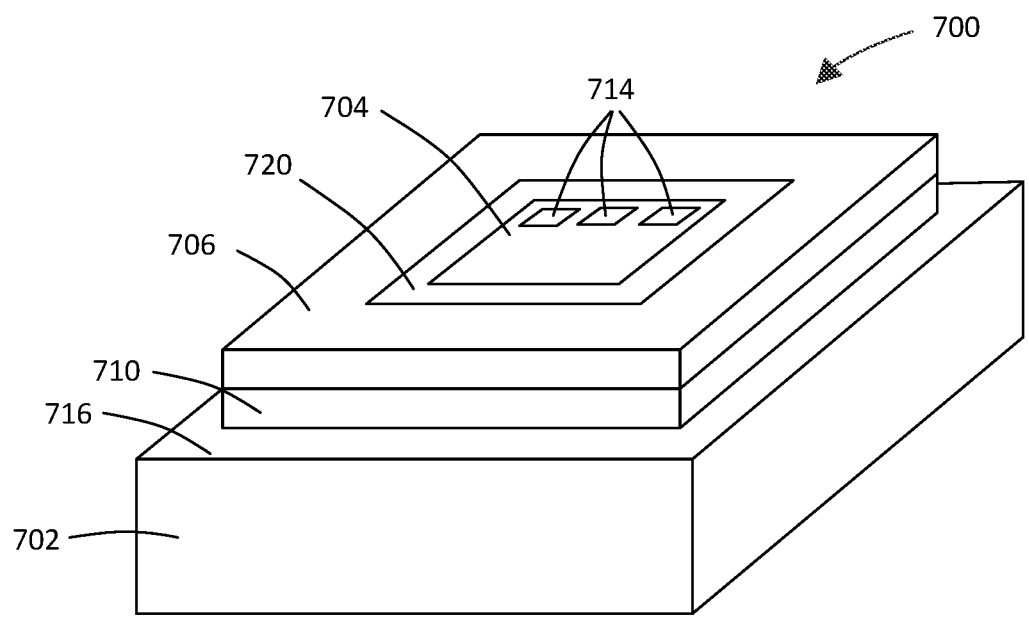
FIG. 7 is a perspective view of an example integrated circuit chip device construction in accordance with an embodiment.
Figure 8:
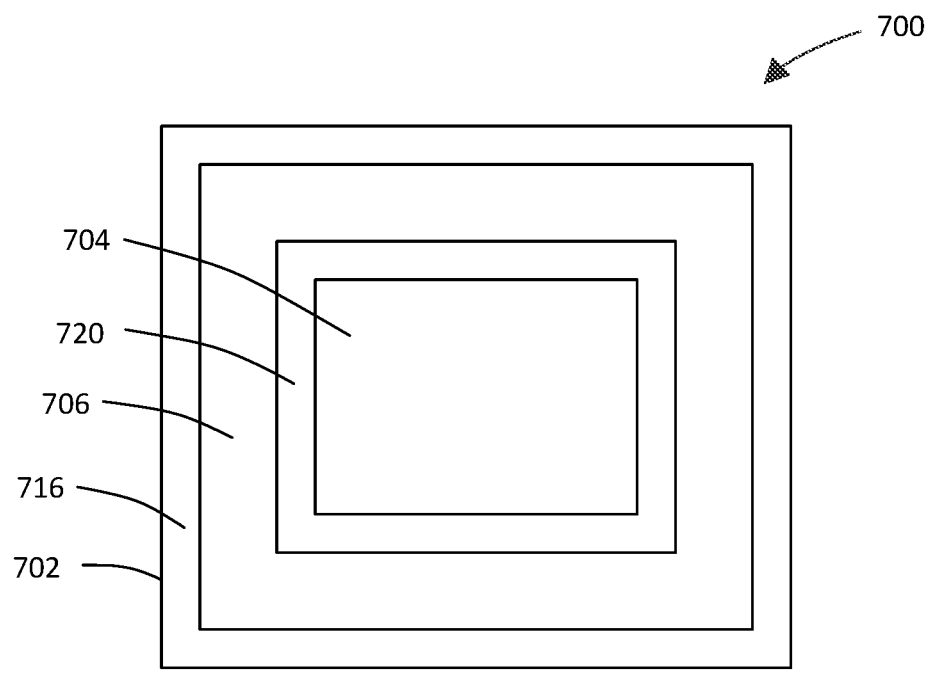
FIG. 8 is a top view of the integrated circuit chip device construction of FIG. 7 in accordance with an embodiment.

Referring to FIGS. 7 and 8, additional example embodiments of an integrated circuit chip device including thermal control will be described. In the example embodiments, a first component 704 of a chip device 700 can be surrounded by a second component 706 of the chip device 700 that generates heat, and the chip device 700 can be constructed so that heat transfer is directed away from the first component 704. The chip device 700 can have a variety of different configurations used to provide thermal control, as will be described with reference to the schematics illustrated in FIGS. 9a-e. The chip device 700 generally comprises a substrate 702, a first component 704, a second component 706, and an insulating layer 710.

The substrate 702 forms a structural component in the chip device 700 and can be shaped and sized to direct heat transfer through the chip device 700 to provide thermal control. The substrate 702 provides the structure, rigidity, and thermal stability to the chip device 700. The substrate 702 provides a support on which the first component 704 and the second component 706 are constructed and held in a desired spatial relationship. The substrate 702 also provides the structure for supporting conductors that can extend between the first component 704 and the second component 706, and/or between any other components included in the chip device 700. The substrate 702 can be formed from monocrystalline silicon, gallium arsenide, germanium, or other structural non-electrically conductive materials. In some example embodiments, a thickness of the substrate is in a range of between about 200 μm and about 400 μm. In at least one example embodiment, the thickness of the substrate 702 is about 300 μm.

The first component 704 is disposed on the substrate 702. In at least one example embodiment, the first component 704 is a photosensitive sensor that is constructed from germanium. The photosensitive sensor can include a plurality of pixels 714 that are arranged in an array. In some embodiments, the first component 704 is a heat sensitive component that exhibits an efficiency that changes with temperature. For example, the first component 704 can be a photosensitive sensor that has an efficiency that decreases as a temperature of the component 104 increases. The construction of the chip device 700 is selected to direct heat transfer away from heat sensitive components so that heat generated by other components does not detrimentally increase the temperature of the heat sensitive components.

The second component 706 is also disposed on the substrate 702. In the illustrated embodiment, the second component 706 can surround the first component 704. In at least one example embodiment, the second component 706 provides analog to digital conversion. In such an example, the second component 706 can generate heat that can cause the temperature of other portions of the chip device 700 to increase.

An insulating layer 710 can be disposed on a surface 716 of the substrate 702. In some example embodiments, the insulating layer 710 can be grown or deposited on the substrate 702. In the illustrated embodiment, the insulating layer 710 is disposed on the first surface 716 of the substrate 702 so that the insulating layer 710 is interposed between the first component 704 and the second component 706, and the substrate 702. The insulating layer 710 can provide electrical insulation between the conductors included in chip device 700. The insulating layer 710 can also provide electrical insulation between the first component 704 and the substrate 702, and between the second component 706 and the substrate 702. In some example embodiments, the insulating layer 710 is formed from $SiO_2$ that is grown on the substrate 702, and the $SiO_2$ has a thermal conductivity of about 1.5 W/mK. The $SiO_2$ insulating layer 710 can be grown on a silicon substrate 702 using thermal, wet, or dry oxidation. In some example embodiments, a thickness of the insulating layer 710 is in a range between about 4.0 µm and about 5.0 µm. In at least one example embodiment, the thickness of the insulating layer 710 is about 4.5 µm.

The chip device 700 can have various configurations, including configurations that employ heat sinks and cooling devices, as shown schematically in FIGS. 9a-e. In at least one example embodiment, shown in FIG. 9a, a chip device 700a comprises a substrate 702a, a first component 704a, a second component 706a, an insulating layer 710a, and a heat sink 912a. An isolation feature, such as an isolation trench 720a, surrounds the first component 704a and thermally isolates the first component 704a from the second component 706a to prevent direct conduction between the first component 704a and the second component 706a. The substrate 702a defines a cavity 924a that is disposed adjacent the first component 704a in a portion of the substrate 702a that would otherwise be supporting the first component 704a. The cavity 924a removes thermal mass of the substrate 702a adjacent the first component 704a and reduces a conduction path from the periphery of the substrate 702a toward the first component 704a. The heat sink 912a extends across the cavity 724a and thermally couples the peripheral portions of the substrate 702a. The heat sink 912a can be used to seal the cavity 924a and the cavity 924a can be filled with a fluid, such as a liquid or gas, that acts as an thermal insulator. The substrate 702a can also include a plurality of conduction features, such as vias 922a, that extend between the second component 706a and the heat sink 912a and provide a reduced thermal resistance between the second component 706a and the heat sink 912a.

Figure 9A:
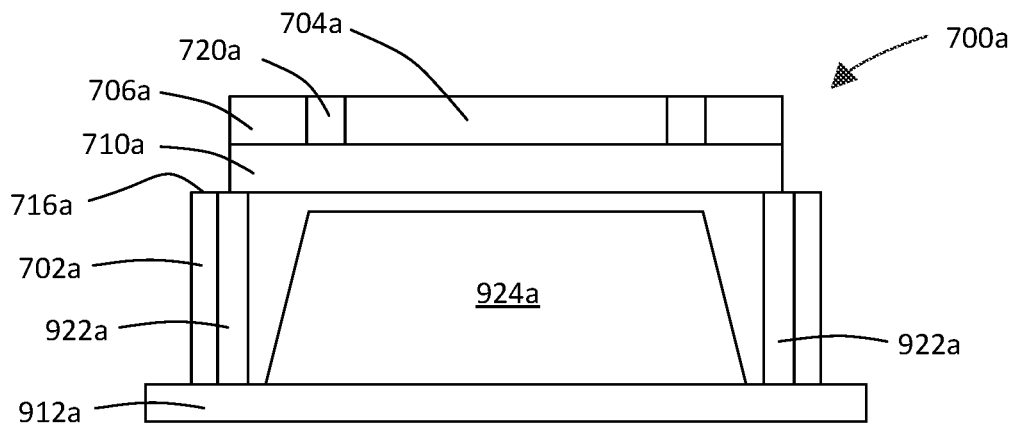
Figure 9B:
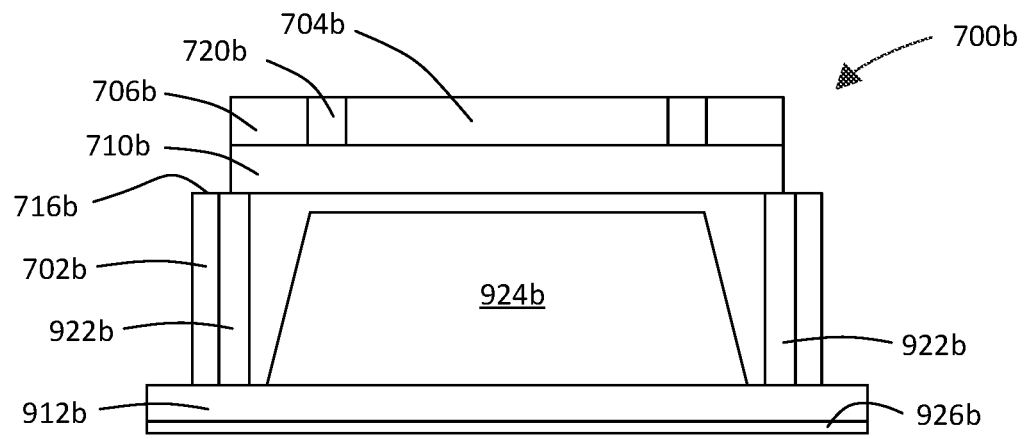

In another example embodiment, shown in FIG. 9b, a chip device 700b comprises a substrate 702b, a first component 704b, a second component 706b, an insulating layer 710b, a heat sink 912b, and a cooling device 926b that is coupled to the heat sink 912b. An isolation feature, such as an isolation trench 720b, surrounds the first component 704b and thermally isolates the first component 704b from the second component 706b to prevent direct conduction between the first component 704b and the second component 706b. The substrate 702b defines a cavity 924b that is disposed adjacent the first component 704b in a portion of the substrate 702b that would otherwise be supporting the first component 704b. The cavity 924b removes thermal mass of the substrate 702b adjacent the first component 704b and reduces a conduction path from the periphery of the substrate 702b toward the first component 704b. The heat sink 912b extends across the cavity 924b and thermally couples the peripheral portions of the substrate 702b. The cooling device 926b, which can be a solid-state cooling device, is thermally coupled to the heat sink 912b to draw heat away from the heat sink 912b. The substrate 702b can also include a plurality of conduction features, such as vias 922b, that extend between the second component 706b and the heat sink 912b and reduce the thermal resistance between the second component 706b and the heat sink 912b.

Figure 9C:
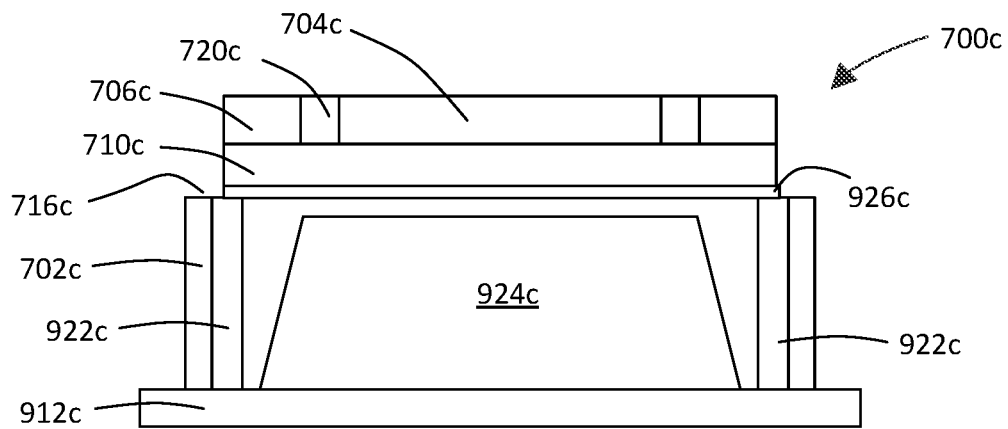

In another example embodiment, shown in FIG. 9c, a chip device 700c comprises a substrate 702c, a first component 704c, a second component 706c, an insulating layer 710c, a heat sink 912c, and a cooling device 926c that is interposed between the substrate 702c and the insulating layer 710c. An isolation feature, such as an isolation trench 720c, surrounds the first component 704c and thermally isolates the first component 704c from the second component 706c to prevent direct conduction between the first component 704c and the second component 706c. The substrate 702c defines a cavity 924c that is disposed adjacent the first component 704c in a portion of the substrate 702c that would otherwise be supporting the first component 704c. The cavity 924c removes thermal mass of the substrate 702c adjacent the first component 704c and reduces a conduction path from the periphery of the substrate 702c toward the first component 704c. The heat sink 912c extends across the cavity 924c and thermally couples the peripheral portions of the substrate 702c. The cooling device 926c, which can be a solid-state cooling device, is thermally coupled to the substrate 702c and to the insulating layer 710c to draw heat away from the interface between the substrate 702c and the insulating layer 710c. In at least one example embodiment, the cooling device 926c can be sized so that it only extends across a portion of the chip device 700c, for example so that the cooling device 926c is disposed only adjacent the first component 704c, or only adjacent the second component 706c, so that it can be used to selectively cool a portion of the chip device 700c. The substrate 702c can also include a plurality of conduction features, such as vias 922c, that extend between the second component 706c and the heat sink 912c to reduce the thermal resistance between the second component 706c and the heat sink 912c.

Figure 9D:
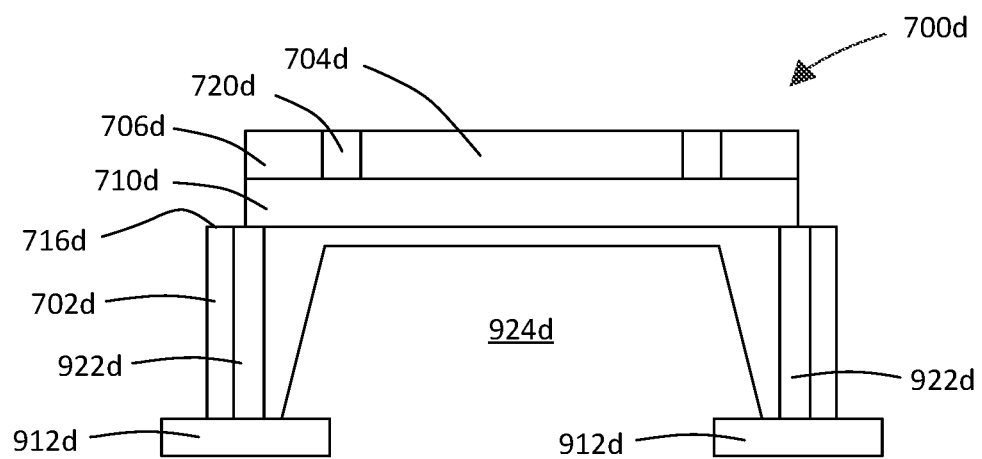

In another example embodiment, shown in FIG. 9d, a chip device 700d comprises a substrate 702d, a first component 704d, a second component 706d, an insulating layer 710d, and a plurality of spaced heat sinks 912d. An isolation feature, such as an isolation trench 720d, surrounds the first component 704d and thermally isolates the first component 704d from the second component 706d to prevent direct conduction between the first component 704d and the second component 706d. The substrate 702d defines a cavity 924d that is disposed adjacent the first component 704d in a portion of the substrate 702d that would otherwise be supporting the first component 704d. The cavity 924d removes thermal mass of the substrate 702d adjacent the first component 704d and reduces a conduction path from the periphery of the substrate 702d toward the first component 704d. The plurality of heat sinks 712d are spaced from each other and are disposed at peripheral portions of the substrate 702d. The substrate 702d can also include a plurality of conduction features, such as vias 922d, that extend between the second component 706d and the heat sink 912d and reduce the thermal resistance between the second component 706d and the heat sink 912d.

Figure 9E:
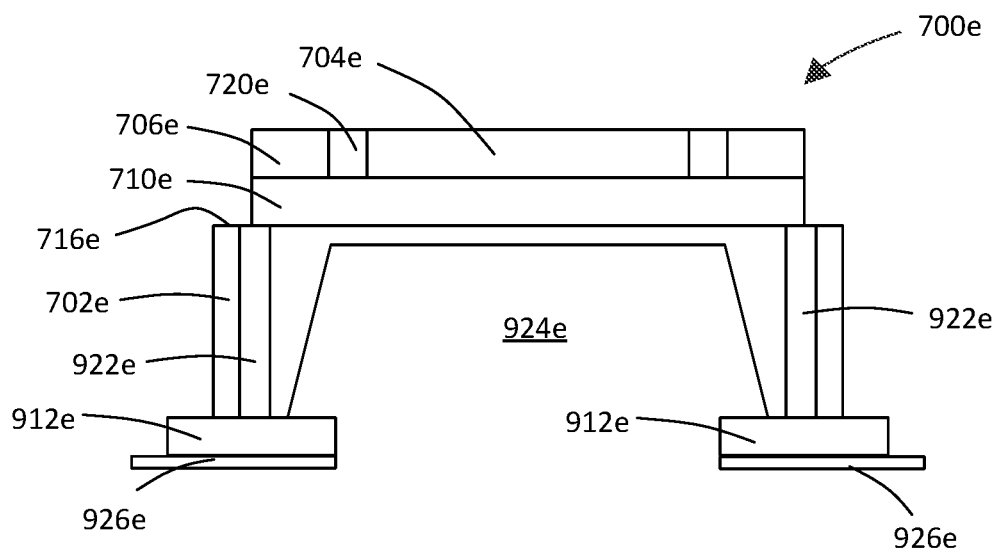

In another example embodiment, shown in FIG. 9e, a chip device 700e comprises a substrate 702e, a first component 704e, a second component 706e, an insulating layer 710e, a plurality of spaced heat sinks 912e, and a plurality of cooling devices 926e that are coupled to the heat sinks 912e. An isolation feature, such as an isolation trench 720e, surrounds the first component 704e and thermally isolates the first component 704e from the second component 706e to prevent direct conduction between the first component 704e and the second component 706e. The substrate 702e defines a cavity 924e that is disposed adjacent the first component 704e in a portion of the substrate 702e that would otherwise be supporting the first component 704e. The cavity 924e removes thermal mass of the substrate 702e adjacent the first component 704e and reduces a conduction path from the periphery of the substrate 702e toward the first component 704e. The heat sink 912e extends across the cavity 924e and thermally couples the peripheral portions of the substrate 702e. Each cooling device 926e, which can be a solid-state cooling device, is thermally coupled to one of the plurality of heat sinks 912e to draw heat away from the respective heat sink 912e. The substrate 702e can also include a plurality of conduction features, such as vias 922e, that extend between the second component 706e and the heat sink 912e to reduce the thermal resistance between the second component 706e and the heat sink 912e.

Any of the embodiments of a chip device described herein can also be housed inside of an enclosure. The enclosure can be sealed to retain air or another gas, such as nitrogen, or the enclosure can be evacuated, to limit convection within the enclosure. In another example embodiment, the enclosure can be filled with a refrigerant.

FIG. 10 depicts a flowchart 1000 of an example method of making a chip device having thermal control in accordance with an embodiment. The method of flowchart 1000 can be used to construct various embodiments of the chip device, such as the constructions illustrated in FIGS. 1-9. Further structural and operational embodiments will be apparent to persons skilled in the relevant art(s) based on the discussion regarding flowchart 1000.

Figure 11A:
Figure 11B:
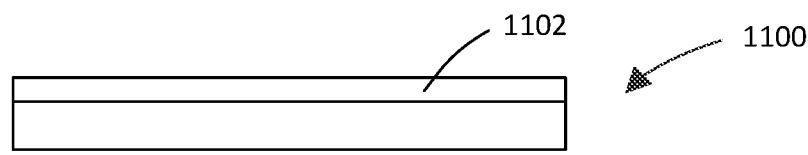

As shown in FIG. 10, the method of flowchart 1000 begins at step 1002. In step 1002, a first wafer is made. For example, a wafer, such as wafer 1100 of FIG. 11a, can be made by slicing a boule formed from a high purity monocrystalline semiconductor, such as silicon or germanium, and polishing the slice. In an example embodiment in which the wafer 1100 is constructed from silicon, an insulating layer 1102 of $SiO_2$ can be grown or deposited on the wafer 1100, as shown in FIG. 11b.

Figure 11C:
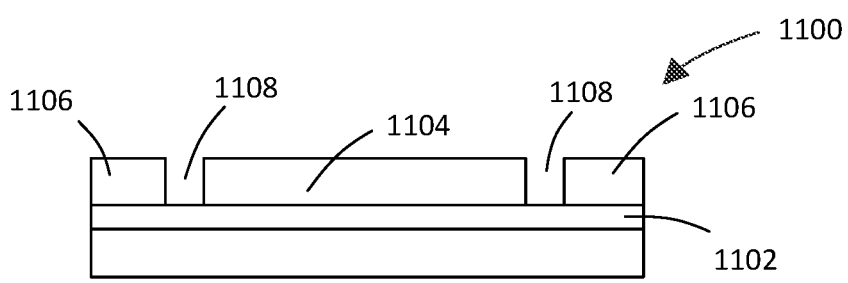
Figure 11D:
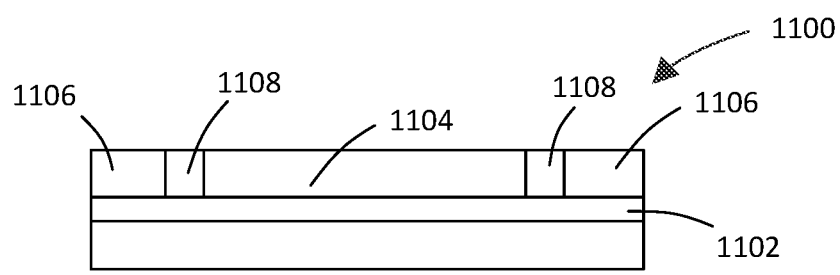

At step 1004, the first wafer is populated with a first component and a second component. Microfabrication techniques such as microlithography, doping, applying thin films, etching, bonding, and polishing can be used to populate the first wafer with components. For example, those techniques can be used to populate the wafer 1100 with a first component 1104 and a second component 1106. In some example embodiments, the first component 1104 is a heat sensitive component, such as a photosensitive sensor, and the second component 1106 generates heat, such as an analog to digital converter. The first component 1104 and the second component 1106 are disposed on the first wafer so that they are spaced, such as by trenches 1108, as shown in FIG. 11c. The trenches 108 can be filled, as shown in FIG. 11d, with a material having relatively low thermal conductivity, such as $SiO_2$.

Figure 11E:
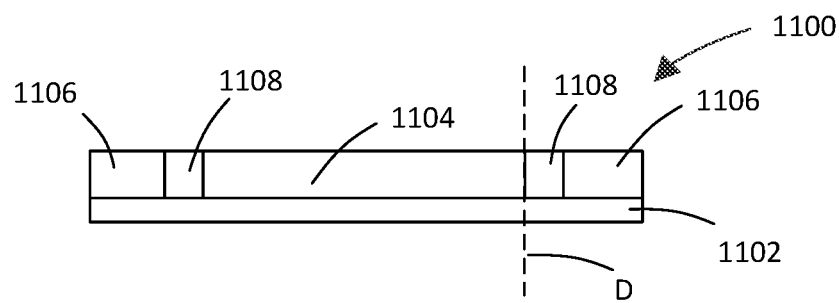
Figure 11F:

After the first wafer 1100 is populated with selected components, the first wafer 1100 can be prepared for bonding to a second wafer. In at least one example embodiment, the wafer 1100 can be diced, or cut, to a selected size or configuration. In at least one example embodiment, the first wafer 1100 can be diced at line D so that the first component 1104 is disposed adjacent an edge of the first wafer 1100. Such a configuration can be used to construct a chip device, such as chip devices 100 and 500 illustrated in FIGS. 1 and 5, respectively. Other preparations for bonding to the second wafer can also be performed, such as polishing or depositing a metallic bonding layer. In some example embodiments, the wafer 1100 is polished to reduce the thickness of the wafer 1100, as shown in FIG. 11e.

At step 1006, a second wafer is made. For example, a wafer, such as wafer 1110 of FIG. 11f, can be made by slicing a boule formed from a high purity monocrystalline semiconductor, such as silicon or germanium, and polishing the slice. In an example embodiment in which the wafer 1110 is constructed from silicon, a layer of $SiO_2$ can be grown or deposited on the wafer 1110 to serve as a mask for subsequent etching.

Figure 11G:
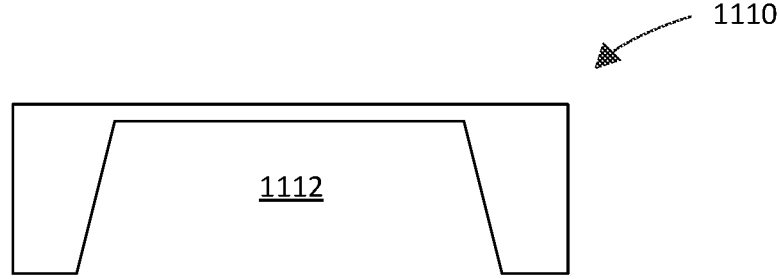

At step 1008, a cavity is formed in the second wafer. For example, a cavity 1112 can be etched into the second wafer 1110. The cavity 1112 can be etched using any wet or dry etching technique. In at least one embodiment, the cavity 1112 is etched using an anisotropic etching technique so that the cavity has tapered side walls, as shown in FIG. 11g. In another embodiment, the cavity 1112 can be formed in the second wafer 1110 so that the cavity 1112 has a constant width.

Figure 11H:
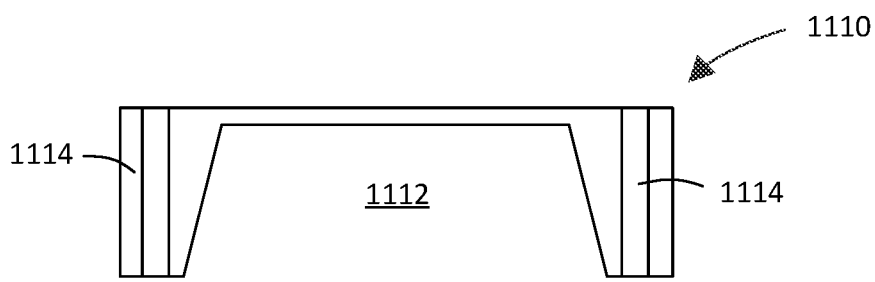

At step 1010, a via is formed in the second wafer. For example a channel can be etched into the second wafer 1110 and the channel filled with a material having a relatively high thermal conductivity to form a via 1114, as shown in FIG. 11h. In some example embodiments, the channel is filled with a material that has a thermal conductivity that is greater than a thermal conductivity of the material of the adjacent portions of the second wafer 1110. For example, the second wafer can be constructed from silicon having a thermal conductivity of about 145.0 W/mK, and the material used to fill the channel can have a thermal conductivity that is greater than 145.0 W/mK. In at least one example embodiment, the channel can be filled with copper having a thermal conductivity of about 386.0 W/mK. In at least one example embodiment, the channel can be filled with aluminum having a thermal conductivity of about 237.0 W/mK. The material used to fill the channel to form the via 1114 can be deposited using electroplating.

At step 1012, a heat sink is formed. For example, the heat sink 112 of FIG. 1 can be constructed from a metallic plate or foil. In other example embodiments, the heat sink can be formed by depositing a material having a relatively high thermal conductivity, on a substrate. The heat sink can be constructed as shown in any of the example embodiments described previously. For example, the heat sink can be a formed from single heat sink member or it can be formed from a plurality of heat sink members.

Figure 11I:
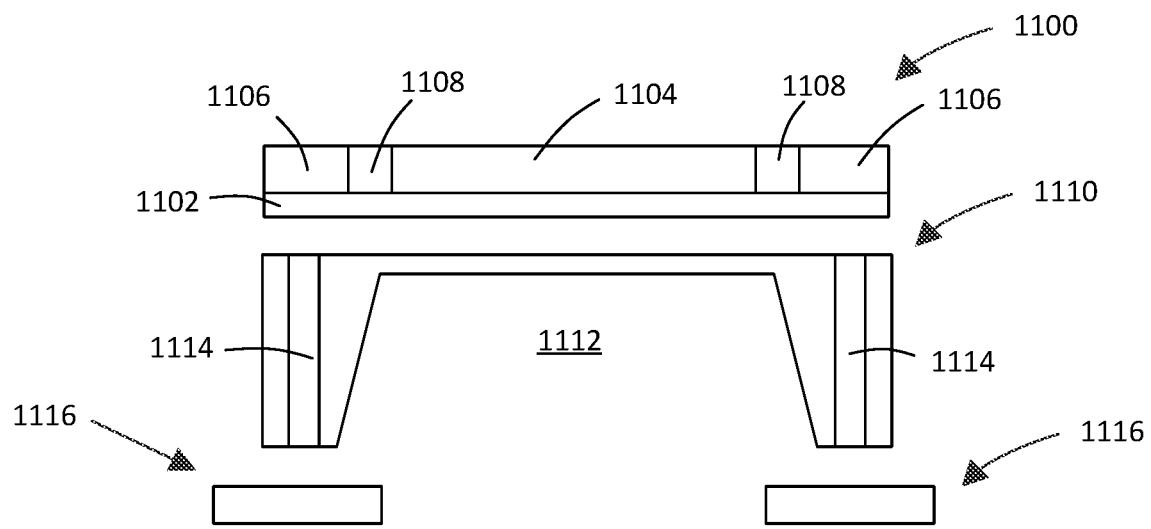
Figure 11J:
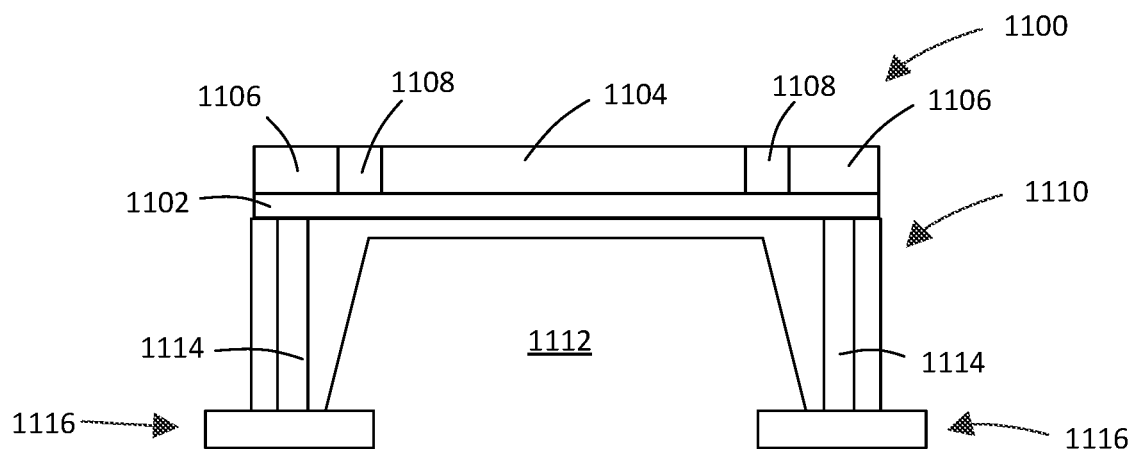

At step 1014, the first wafer, the second wafer, and the heat sink are coupled. The first wafer, the second wafer, and the heat sink are coupled so that the first component is adjacent the cavity formed in the second wafer. The first wafer, the second wafer, and the heat sink are also coupled so that the via extends between the second component and the heat sink. For example, as shown in FIGS. 11*i* and 11*j*, the first wafer 1100, the second wafer 1110, and the heat sinks 1116 are aligned into a desired configuration and the parts are coupled, such as by using wafer bonding techniques. As shown in FIG. 11*j*, the first wafer 1100, the second wafer 1110, and the heat sinks 1116 are coupled so that the first component 1104 is adjacent the cavity 1112 formed in the second wafer 1110, and so that a via 1114 extends between the second component 1106 and a heat sink 1116.

III. Further Discussion of Some Example Embodiments

A first example chip device comprises a substrate, a first component, a second component, and a heat sink. The first component is disposed on the substrate. The second component is disposed on the substrate spaced from the first component, and the second component generates heat. The heat sink is coupled to the substrate so that at least a portion of the substrate is interposed between the second component and the heat sink. A thermal resistance between the second component and the heat sink is less than a thermal resistance between the second component and the first component.

In a first aspect of the first example chip device, the substrate includes a cavity, and the first component is disposed adjacent to the cavity.

In a second aspect of the first example chip device, the chip device further comprises a via extending between the second component and the heat sink. The substrate is constructed from a first material having a first thermal conductivity and the via is constructed from a second material having a second thermal conductivity that is greater than the first thermal conductivity. The second aspect of the first example chip device can be implemented in combination with the first aspect of the first example chip device, though the example embodiments are not limited in this respect.

In a third aspect of the first example chip device, the first component is a photosensitive sensor having an efficiency that decreases as a temperature of the photosensitive sensor increases, wherein the photosensitive sensor includes an array of pixels. The third aspect of the first example chip device can be implemented in combination with the first and/or second aspect of the first example chip device, though the example embodiments are not limited in this respect.

In a fourth aspect of the first example chip device, the first component is disposed adjacent a perimeter edge of the substrate. The fourth aspect of the first example chip device can be implemented in combination with the first, second and/or third aspect of the first example chip device, though the example embodiments are not limited in this respect.

In a fifth aspect of the first example chip device, the second component includes an analog to digital converter. The fifth aspect of the first example chip device can be implemented in combination with the first, second, third and/or fourth aspect of the first example chip device, though the example embodiments are not limited in this respect.

In a sixth aspect of the first example chip device, the chip device further comprises a cooling device coupled to the heat sink. The sixth aspect of the first example chip device can be implemented in combination with the first, second, third, fourth and/or fifth aspect of the first example chip device, though the example embodiments are not limited in this respect.

In an implementation of the sixth aspect of the first example chip device, the cooling device is a solid-state cooling device.

A second example chip device comprises a substrate, a first component, a second component, a heat sink, and a via. The substrate is constructed from a first material having a first thermal conductivity and includes a cavity. The first component is disposed on the substrate adjacent the cavity. The second component is disposed on the substrate spaced from the first component, and the second component generates heat. The heat sink is coupled to the substrate. The via extends between the second component and the heat sink and is constructed of a second material having a second thermal conductivity that is greater than the first thermal conductivity.

In a first aspect of the second example chip device, the cavity is filled with a third material having a third thermal conductivity that is less than the first thermal conductivity.

In a second aspect of the second example chip device, the first component is a photosensitive sensor having an efficiency that decreases as a temperature of the photosensitive sensor increases, and the photosensitive sensor includes an array of pixels. The second aspect of the second example chip device can be implemented in combination with the first aspect of the second example chip device, though the example embodiments are not limited in this respect.

In a third aspect of the second example chip device, the first component is disposed adjacent a perimeter edge of the substrate. The third aspect of the second example chip device can be implemented in combination with the first and/or second aspect of the second example chip device, though the example embodiments are not limited in this respect.

In a fourth aspect of the second example chip device, the second component includes an analog to digital converter. The fourth aspect of the second example chip device can be implemented in combination with the first, second and/or third aspect of the second example chip device, though the example embodiments are not limited in this respect.

In a fifth aspect of the second example chip device, the chip device further comprises a cooling device coupled to the heat sink. The fifth aspect of the second example chip device can be implemented in combination with the first, second, third and/or fourth aspect of the second example chip device, though the example embodiments are not limited in this respect.

In an implementation of the fifth aspect of the second example chip device, the cooling device is a solid-state cooling device.

An example method of making a chip device having thermal control comprises making a first wafer, populating the first wafer with a first component and a second component, making a second wafer, forming a cavity in the second wafer, forming a via in the second wafer, making a heat sink, and coupling the first wafer, the second wafer, and the heat sink. The second component is spaced from the first component and generates heat during use. The second wafer is made from a first material having a first thermal conductivity. The via is formed in the second wafer and constructed from a second material having a second thermal conductivity that is greater than the first thermal conductivity. The first wafer, the second wafer, and the heat sink are coupled so that the second wafer is at least partially interposed between the heat sink and the first wafer, the first component is disposed adjacent the cavity, and the via extends between the second component and the heat sink.

In a first aspect of the example method, the method further comprises dicing the first wafer adjacent the first component.

In a second aspect of the example method, the method further comprises forming a first metal layer on the first wafer, and forming a second metal layer on the second wafer. The first metal layer of the first wafer is coupled to the second metal layer of the second wafer. The second aspect of the example method can be implemented in combination with the first aspect of the example method, though the example embodiments are not limited in this respect.

In a third aspect of the example method, the method further comprises filling the cavity with a third material having a third thermal conductivity that is less than the first thermal conductivity. The third aspect of the example method can be implemented in combination with the first and/or second aspect of the example method, though the example embodiments are not limited in this respect.

In a fourth aspect of the example method, the method further comprises coupling a solid-state cooling device to the heat sink. The fourth aspect of the example method can be implemented in combination with the first, second and/or third aspect of the example method, though the example embodiments are not limited in this respect.

IV. Conclusion

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims, and other equivalent features and acts are intended to be within the scope of the claims.

What is claimed is:

1. A chip device, comprising:
a substrate;
a first component disposed on the substrate, the first component having an efficiency that decreases as a temperature of the first component increases;
a second component disposed on the substrate spaced from the first component, wherein the second component generates heat; and
a heat sink coupled to the substrate so that at least a portion of the substrate is interposed between the second component and the heat sink,
wherein a thermal resistance between the second component and the heat sink is less than a thermal resistance between the second component and the first component.

2. The chip device of claim 1, wherein the substrate includes a cavity, wherein the first component is disposed adjacent to the cavity.

3. The chip device of claim 1, further comprising a via extending between the second component and the heat sink, wherein the substrate is constructed from a first material having a first thermal conductivity and the via is constructed from a second material having a second thermal conductivity that is greater than the first thermal conductivity.

4. The chip device of claim 1, wherein the first component is a photosensitive sensor having an efficiency that decreases as a temperature of the photosensitive sensor increases, wherein the photosensitive sensor includes an array of pixels.

5. The chip device of claim 1, wherein the first component is disposed adjacent a perimeter edge of the substrate.

6. The chip device of claim 1, wherein the second component includes an analog to digital converter.

7. The chip device of claim 1, further comprising a cooling device coupled to the heat sink.

8. The chip device of claim 7, wherein the cooling device is a solid-state cooling device.

9. A chip device, comprising:
a substrate constructed from a first material having a first thermal conductivity, the substrate including a cavity;
a first component disposed on the substrate, wherein a projection of the first component on a surface of the substrate overlaps a projection of the cavity on the surface of the substrate;
a second component disposed on the substrate spaced from the first component, wherein the second component generates heat;
a heat sink coupled to the substrate; and
a via extending between the second component and the heat sink, wherein the via is constructed of a second material having a second thermal conductivity that is greater than the first thermal conductivity.

10. The chip device of claim 9, wherein the cavity is filled with a third material having a third thermal conductivity that is less than the first thermal conductivity.

11. The chip device of claim 9, wherein the first component is a photosensitive sensor having an efficiency that decreases as a temperature of the photosensitive sensor increases, wherein the photosensitive sensor includes an array of pixels.

12. The chip device of claim 11, wherein the first component is disposed adjacent a perimeter edge of the substrate.

13. The chip device of claim 9, wherein the second component includes an analog to digital converter.

14. The chip device of claim 9, further comprising a cooling device coupled to the heat sink.

15. The chip device of claim 14, wherein the cooling device is a solid-state cooling device.

16. A method of making a chip device having thermal control, comprising:
making a first wafer;
populating the first wafer with a first component and a second component that is spaced from the first component, wherein the second component generates heat during use;
making a second wafer from a first material having a first thermal conductivity;
forming a cavity in the second wafer;
forming a via in the second wafer, wherein the via is constructed from a second material having a second thermal conductivity that is greater than the first thermal conductivity;
making a heat sink; and
coupling the first wafer, the second wafer, and the heat sink so that the second wafer is at least partially interposed between the heat sink and the first wafer, wherein the first component is disposed adjacent the cavity, and wherein the via extends between the second component and the heat sink.

17. The method of making a chip device of claim 16, further comprising dicing the first wafer adjacent the first component.

18. The method of making a chip device of claim 16, further comprising:
   forming a first metal layer on the first wafer; and
   forming a second metal layer on the second wafer,
   wherein the first metal layer of the first wafer is coupled to the second metal layer of the second wafer.

19. The method of making a chip device of claim 16, further comprising filling the cavity with a third material having a third thermal conductivity that is less than the first thermal conductivity.

20. The method of making a chip device of claim 16, further comprising coupling a solid-state cooling device to the heat sink.

\* \* \* \* \*